(12) United States Patent
Zhang et al.

(10) Patent No.: US 8,625,294 B2
(45) Date of Patent: Jan. 7, 2014

(54) EXPANSION CARD MOUNTING APPARATUS

(75) Inventors: Xiang Zhang, Wuhan (CN); Heng Tao, Wuhan (CN); Chao Geng, Wuhan (CN); Li-Fu Xu, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 203 days.

(21) Appl. No.: 13/370,438

(22) Filed: Feb. 10, 2012

(65) Prior Publication Data

US 2012/0212915 A1    Aug. 23, 2012

(30) Foreign Application Priority Data

Feb. 21, 2011  (CN) .......................... 2011 1 0043587

(51) Int. Cl.
*H05K 5/00* (2006.01)
(52) U.S. Cl.
USPC .......................................... 361/759; 361/726
(58) Field of Classification Search
USPC ............ 361/679.02, 724–727, 732, 736, 748, 361/752, 759, 801–803, 807, 809, 810
See application file for complete search history.

(56) References Cited

U.S. PATENT DOCUMENTS 8,248,770 B2 * 8/2012 Tung et al. ................ 361/679.02
2012/0134091 A1 * 5/2012 Zhang et al. ............. 361/679.32

* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

An expansion card mounting apparatus including an enclosure, the enclosure including a support plate and a flange, the enclosure defining a slot, the support plate and the flange located above the slot; a mounting plate, the mounting plate including a mounting plate body and a bent portion extending from the mounting plate body; the mounting plate body securing an expansion card and covering the slot; the bent portion located on the support plate; a securing element, the securing element pressing the bent portion; and a pressing member, the pressing member including a resilient arm and a securing portion extending from the resilient arm; the resilient arm including a first and a second ends, the first end resisting the expansion card; the second end resisting on the securing element; and the securing portion engaging with the flange to enable the pressing member sandwiched between the securing element and the flange.

15 Claims, 5 Drawing Sheets

EXPANSION CARD MOUNTING APPARATUS

BACKGROUND

1. Technical Field

The present disclosure relates to mounting apparatuses, and more particularly to a mounting apparatus for mounting expansion cards in a computer enclosure.

2. Description of Related Art

A computer system usually includes expansion cards for enhancing functionalities of the computer system, such as sound cards, video cards, and graphics cards. The expansion cards are often fixed in the computer system with screws. However, using screws to fix the expansion cards is very laborious and time-consuming.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
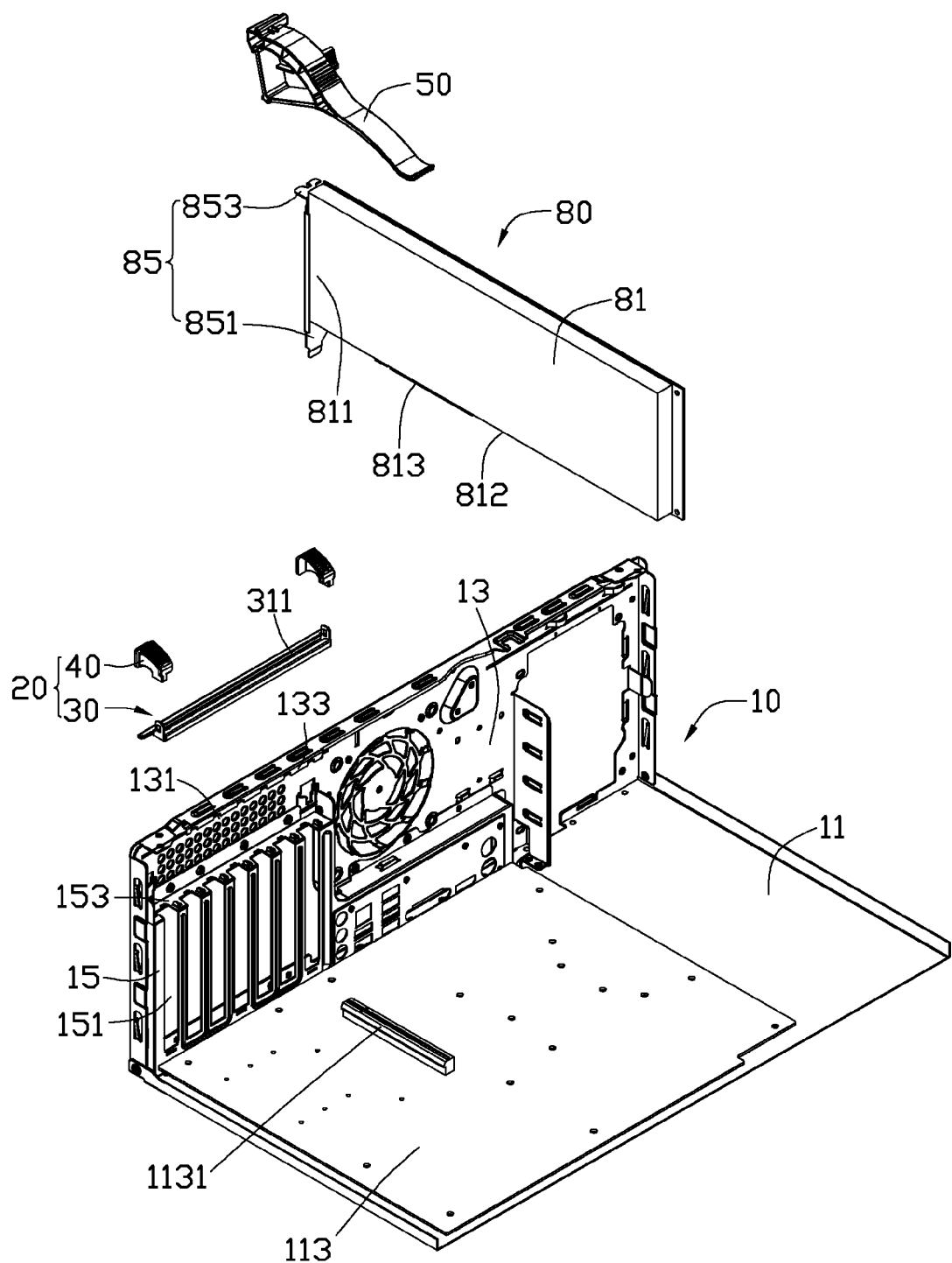
FIG. 1 is an isometric and exploded view of an expansion card mounting apparatus and an expansion card.

Referring to FIG. 1, one embodiment of an expansion card mounting apparatus for mounting an expansion card 80 includes an enclosure 10, a securing member 20, a pressing member 50, and a mounting plate 85.

The expansion card 80 includes a card body 81. The card body 81 includes a first side 811 and a second side 812 adjacent to the first side 811. The mounting plate 85 includes a mounting plate body 851 and a bent portion 853 extending from the mounting plate body 851. The first side 811 is secured to the mounting plate body 851 of the mounting plate 85. The second side 812 includes an inserting terminal 813. In one embodiment, the expansion card 80 is graphic card.

The enclosure 10 includes a bottom panel 11 and a rear panel 13 extending perpendicularly from the bottom panel 11. A printed circuit board 113 is mounted on the bottom panel 11. The printed circuit board 113 includes an inserting slot 1131 corresponding to the inserting terminal 813. The rear panel 13 includes a rear panel body 131 and a flange 133 extending from the rear panel body 131. The rear panel 13 further includes a mounting portion 15 extending from the rear panel body 131. The mounting portion 15 defines a plurality of slots 151. The mounting portion 15 includes a support plate 153 extending perpendicularly from the rear panel body 131.

The securing member 20 includes a securing element 30 and two positioning elements 40. The securing element 30 is rotatably mounted to the mounting portion 15. Each of the two positioning elements 40 is rotatably mounted to the mounting portion 15. The securing element 30 defines a securing opening 311. The securing element 30 is configured to press the bent portion 853 of the mounting plate 85 on the support plate 153.

Figure 2:
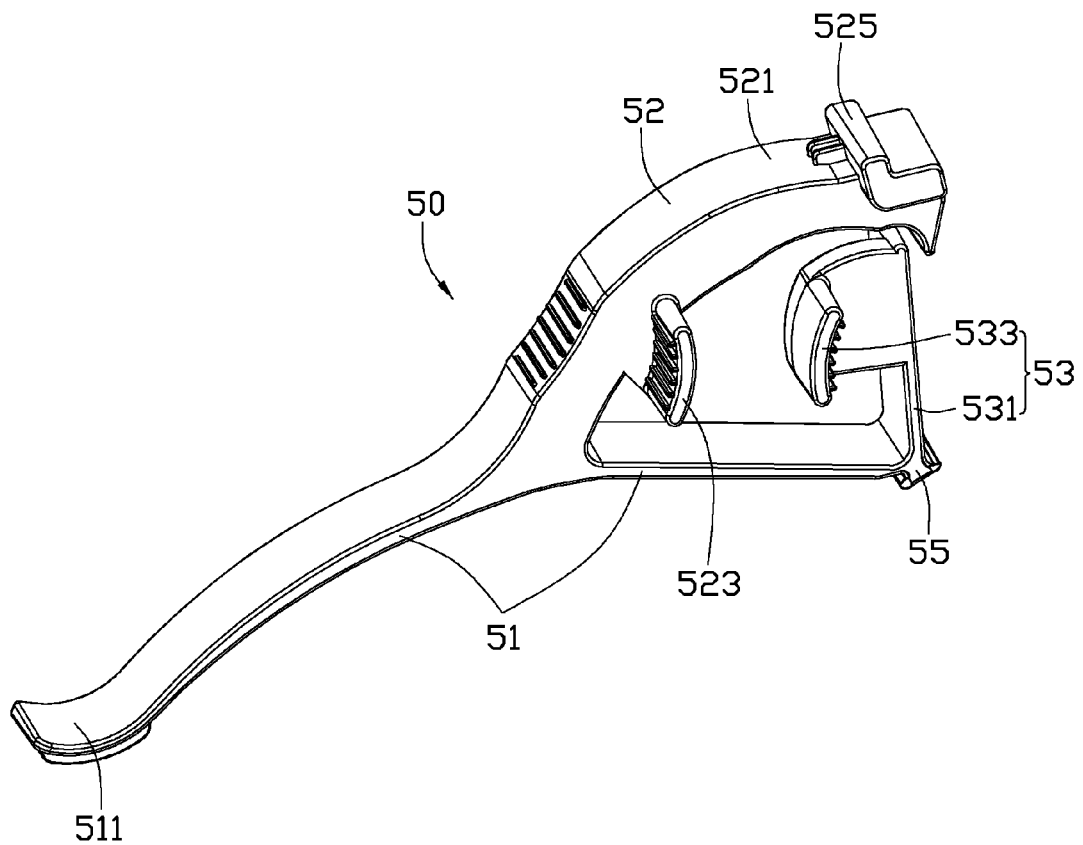
FIG. 2 is an isometric view of a pressing member of FIG. 1.

Referring to FIG. 2, the pressing member 50 includes a resilient arm 51 and a securing portion 52 extending from the resilient arm 51. The resilient arm 51 is arc-shaped. The resilient arm 51 includes a first end 511 and a second end 55. The second end 55 is configured to engage with the securing opening 311 of the securing element 30. The pressing member 50 further includes a handling portion 53 extending from the second end 55. The handling portion 53 includes a connecting arm 531 extending from the second end 55 and a first pressing tab 533 extending from the connecting arm 531. The securing portion 52 includes an extending arm 521, a second pressing tab 523 extending from the extending arm 521, and a securing protrusion 525 extending from the extending arm 521. The securing protrusion 525 is L-shaped. The securing protrusion 525 is configured to engage with the flange 133.

Figure 3:
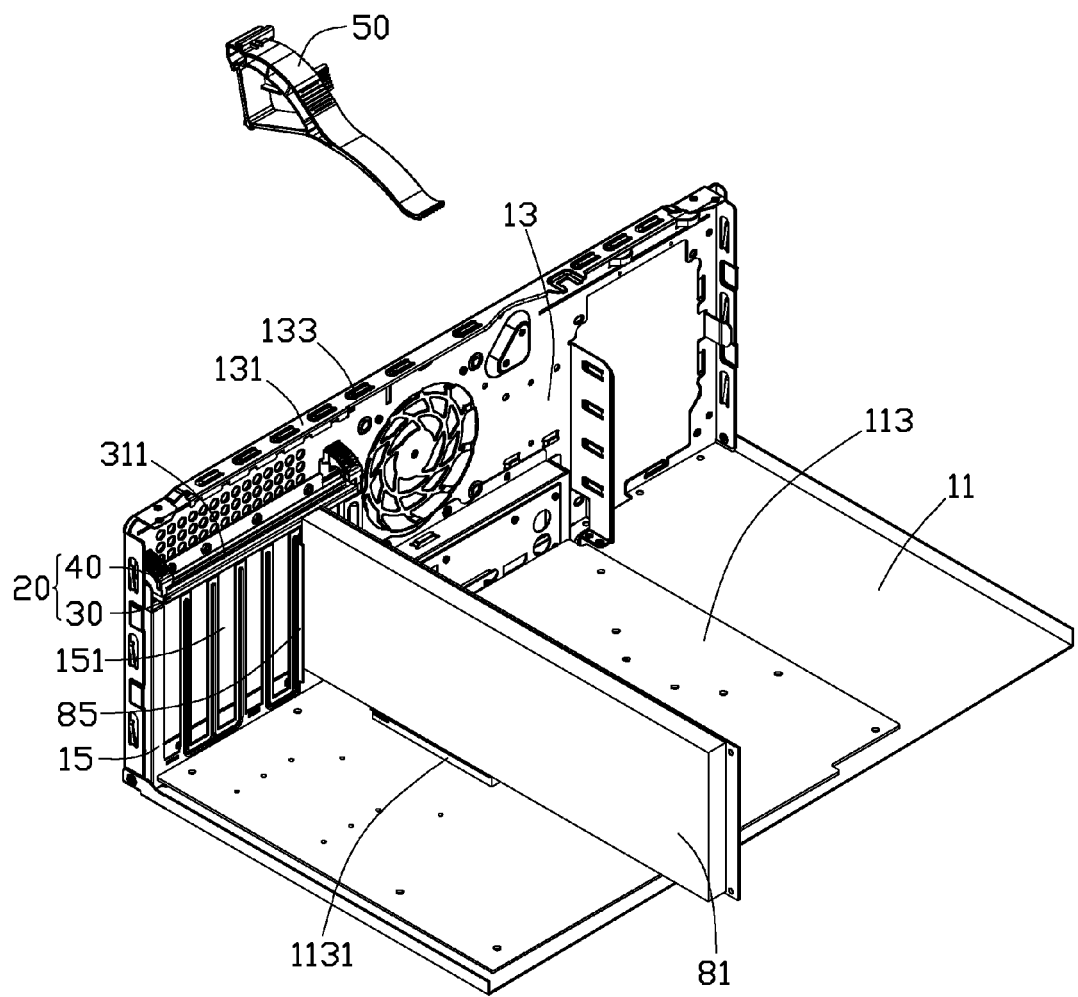
FIG. 3 is an isometric and partial assembled view of FIG. 1.
Figure 4:
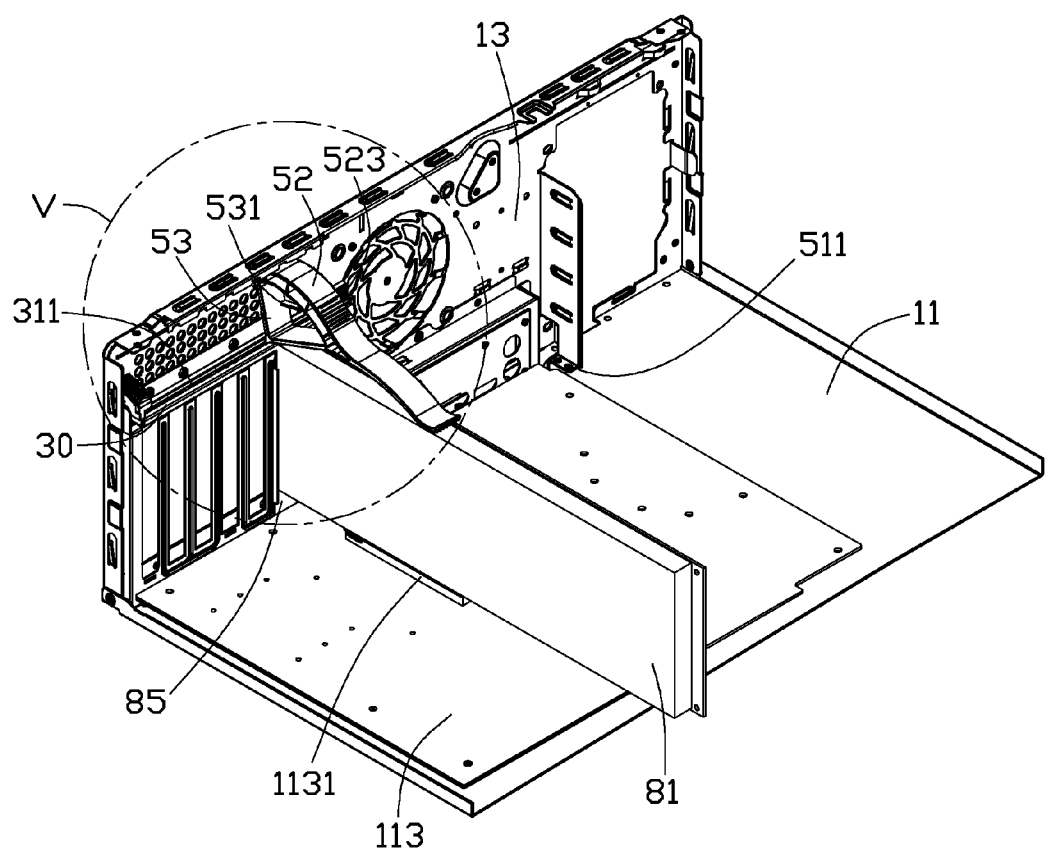
FIG. 4 is an assembled view of FIG. 1.
Figure 5:
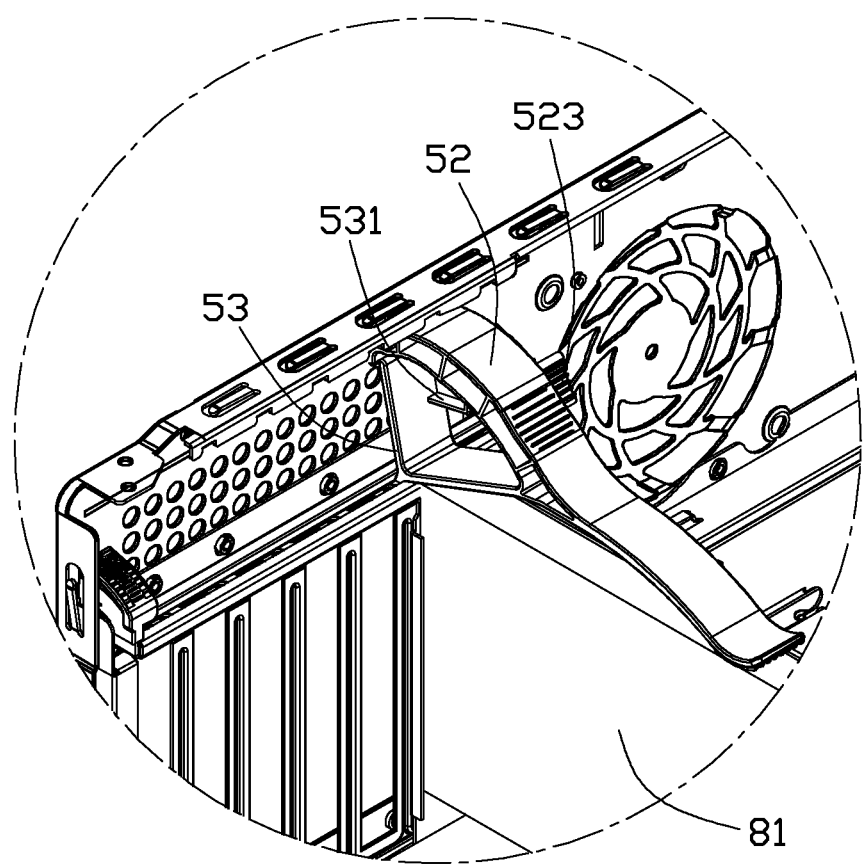
FIG. 5 is an enlarged view of the circled portion V of FIG. 4.

Referring to FIGS. 3 to 5, in assembly, the expansion card 80 is moved towards the enclosure 10. The inserting terminal 813 of the expansion card 80 is inserted into the inserting slot 1131 of the printed circuit board 113. The mounting plate body 851 of the mounting plate 85 covers corresponding plurality of slots 151 of the rear panel 13. The bent portion 853 of the mounting plate 85 is located on the support plate 153 of the rear panel 13. The securing element 30 is rotatably mounted to the mounting portion 15 of the rear panel 13. The securing element 30 is located on the bent portion 853. Each of the two positioning elements 40 is rotatably mounted to the mounting portion 15 and resists the securing element 30 to prevent the securing element 30 from rotating to move away from the bent portion 853. The first end 511 of the resilient arm 51 of the pressing member 50 is located on the card body 81 of the expansion card 80 and the second end 55 of the resilient arm 51 engages with the securing opening 311 of the securing element 30. The extending arm 521 of the securing portion 52 of the pressing member 50 is pressed down to enable the securing protrusion 525 to engage with the flange 133 of the rear panel 13. Thus, the pressing member 50 is sandwiched between the flange 133 and the support plate 153. At this time, the first end 511 resists on the card body 81 to prevent the card body 81 from moving along a direction perpendicular to the bottom panel 11.

In disassembly, the first pressing tab 533 and the second pressing tab 523 are pressed to move close to each other. The second end 55 is driven to disengage from the securing opening 311. The first end 511 is pulled up to move away from the card body 81. The pressing member 50 is pulled to move away from the rear panel to enable the securing protrusion 525 to disengage from the flange 133. Thereby, the pressing member 50 can be easily removed from the enclosure 10.

It is to be understood, however, that even though numerous characteristics and advantages of the embodiments have been set forth in the foregoing description, together with details of the structure and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An expansion card mounting apparatus, comprising:
   an enclosure, the enclosure comprising a support plate and a flange, the enclosure defining a slot, the support plate and the flange located above the slot;
   a mounting plate, the mounting plate comprising a mounting plate body and a bent portion extending from the mounting plate body; the mounting plate body configured to secure an expansion card and covering the slot; the bent portion located on the support plate;
   a securing element, the securing element pressing the bent portion; and
   a pressing member, the pressing member comprising a resilient arm and a securing portion extending from the resilient arm; the resilient arm comprising a first end and a second end, the first end configured to resist the expansion card; the second end resisting on the securing element; and the securing portion engaging with the flange to enable the pressing member to be sandwiched between the securing element and the flange.

2. The expansion card mounting apparatus of claim 1, wherein the pressing member further comprises a handling portion extending from the second end; the handling portion comprises a connecting arm extending from the second end and a first pressing tab extending from the connecting arm; and the first pressing tab is configured to be pressed to drive the second end to move away from the securing element.

3. The expansion card mounting apparatus of claim 2, wherein the securing portion of the pressing member comprises an extending arm extending from the resilient arm, and a second pressing tab extending from the extending arm, and a securing protrusion extending from the extending arm; the second pressing tab is configured to be pressed with the first pressing tab; and the securing protrusion engages with the flange of the enclosure.

4. The expansion card mounting apparatus of claim 3, wherein the securing protrusion is L-shaped.

5. The expansion card mounting apparatus of claim 1, wherein the securing element defines a securing opening, and the second end of the pressing member engages with the securing opening.

6. The expansion card mounting apparatus of claim 1, wherein the resilient arm is arc-shaped.

7. The expansion card mounting apparatus of claim 1, wherein the securing element is rotatably mounted to the enclosure.

8. The expansion card mounting apparatus of claim 1, wherein the enclosure comprises a rear panel; the rear panel comprises rear panel body, the flange extending from the rear panel body; and the support plate extending from the rear panel body perpendicularly.

9. An expansion card assembly, comprising:
   an enclosure, the enclosure comprising a bottom panel and a rear panel extending from the bottom panel; the rear panel substantially perpendicular to the bottom panel; the rear panel comprising a rear panel body, a flange extending from the rear panel body, and a support plate extending from the rear panel body;
   an expansion card;
   a mounting plate, the mounting plate comprising a mounting plate body and a bent portion extending from the mounting plate body; the mounting plate body secured to the expansion card; the bent portion located on the support plate;
   a securing element, the securing element pressing the bent portion; and
   a pressing member, the pressing member comprising a resilient arm and a securing portion extending from the resilient arm; the securing portion engaging with the flange; the resilient arm resiliently resisting the securing element and the expansion card to prevent the expansion card from moving along a direction substantially perpendicular to the bottom panel.

10. The expansion card assembly of claim 9, wherein the resilient arm is arc-shaped; the resilient arm comprises a first end and a second end, the first end resists the expansion card; and the second end resists on the securing element.

11. The expansion card assembly of claim 10, wherein the pressing member further comprises a handling portion extending from the second end; the handling portion comprises a connecting arm extending from the second end and a first pressing tab extending from the connecting arm; and the first pressing tab is configured to be pressed to drive the second end to move away from the securing element.

12. The expansion card assembly of claim 11, wherein the securing portion of the pressing member comprises an extending arm extending from the resilient arm, and a second pressing tab extending from the extending arm, and a securing protrusion extending from the extending arm; the second pressing tab is configured to be pressed with the first pressing tab; and the securing protrusion engages with the flange of the enclosure.

13. The expansion card assembly of claim 12, wherein the securing protrusion is L-shaped.

14. The expansion card assembly of claim 10, wherein the securing element defines a securing opening, and the second end of the pressing member engages with the securing opening.

15. The expansion card assembly of claim 9, wherein the securing element is rotatably mounted to the enclosure.

* * * * *